US012805108B2

(12) United States Patent
Tu et al.

(10) Patent No.: US 12,805,108 B2
(45) Date of Patent: Nov. 17, 2026

(54) PEROVSKITE SOLAR CELL, THIN-FILM COMPOSITE ELECTRODE AND PREPARATION METHOD THEREFOR, POWER GENERATING DEVICE, AND POWER CONSUMING DEVICE

(71) Applicant: CONTEMPORARY AMPEREX TECHNOLOGY CO., LIMITED, Ningde (CN)

(72) Inventors: Bao Tu, Ningde (CN); Wenming Guo, Ningde (CN); Yongsheng Guo, Ningde (CN); Guodong Chen, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 18/786,488

(22) Filed: Jul. 27, 2024

(65) Prior Publication Data

US 2024/0389369 A1 Nov. 21, 2024

Related U.S. Application Data

(63) Continuation of application No. PCT/CN2022/132720, filed on Nov. 18, 2022.

(30) Foreign Application Priority Data

Jan. 30, 2022 (CN) ......................... 202210113364.5

(51) Int. Cl.
*H10K 30/82* (2023.01)
*H10K 71/60* (2023.01)
*H10K 101/40* (2023.01)

(52) U.S. Cl.
CPC ............ *H10K 30/82* (2023.02); *H10K 71/60* (2023.02); *H10K 2101/40* (2023.02)

(58) Field of Classification Search
CPC .... H10K 30/82; H10K 71/60; H10K 2101/40; H10K 85/50; H10K 2102/351;
(Continued)

(56) References Cited

U.S. PATENT DOCUMENTS

2020/0091355 A1* 3/2020 Barr ........................ H10F 19/37

FOREIGN PATENT DOCUMENTS

CN 106887520 A 6/2017
CN 109802042 A 5/2019
(Continued)

OTHER PUBLICATIONS

Lu (High-Performance, Semitransparent, Easily Tunable Vivid Colorful Perovskite Photovoltaics Featuring Ag/ITO/Ag Microcavity Structures) J. Phys. Chem. C 2016, 120, 4233-4239 (Year: 2016).*
(Continued)

*Primary Examiner* — Angelo Trivisonno
(74) *Attorney, Agent, or Firm* — K&L Gates LLP

(57) ABSTRACT

The present application discloses a perovskite solar cell, a thin-film composite electrode and a preparation method therefor, a power generating device, and a power consuming device. The perovskite solar cell sequentially includes transparent conductive glass, a first charge transport layer, a perovskite light-absorbing layer, a second charge transport layer and a thin-film composite electrode; wherein the thin-film composite electrode comprises a first metal layer provided on the second charge transport layer, a conductive oxide layer provided on the first metal layer, and a second metal layer provided on the conductive oxide layer. In a perovskite solar cell of an embodiment of the present application, the thin-film composite electrode is a semi-transparent electrode, which increases the extraction rate of charge carriers at the interface and reduces the overall series resistance of the device, thus enabling the device to have an
(Continued)

excellent photoelectric performance while ensuring the transparency thereof.

10 Claims, 5 Drawing Sheets

(58) Field of Classification Search
CPC ........ H10K 30/40; H10K 30/81; H10K 30/15; H10K 30/50; Y02E 10/549
See application file for complete search history.

(56) References Cited

FOREIGN PATENT DOCUMENTS

| | | | | |
|---|---|---|---|---|
| CN | 109935690 | A | | 6/2019 |
| CN | 110078739 | A | | 8/2019 |
| CN | 111710786 | A | | 9/2020 |
| CN | 212113754 | U | * | 12/2020 |
| CN | 112366275 | A | | 2/2021 |
| CN | 113488594 | A | | 10/2021 |
| JP | 2013516756 | A | | 5/2013 |
| JP | 2019145621 | A | | 8/2019 |
| JP | 2022500861 | A | | 1/2022 |

OTHER PUBLICATIONS

Sun (Microstructure and optical properties of Ag/ITO/Ag multilayer films) Nanoscale Research Letters 2013, 8:424 (Year: 2013).*
English CN-212113754-U (Year: 2020).*
Chen, Chih-Ping et al., Semitransparent, easily tunable vivid colorful perovskite solar cells featuring Ag/ITO/Ag Microcavity structures, 2016 IEEE 43rd Photovoltaic Specialists Conference (PVSC), Portland, OR, USA , United States, IEEE, Jun. 10, 2016, pp. 0751-0755, https://ieeexplore.ieee.org/stamp/stamp.jsp?tp=&arnumber=7749703, DOI: 10.1109/PVSC.2016.7749703.
International Search Report received in the corresponding International Application PCT/CN2022/132720, mailed Jan. 29, 2023.
The Notice of Reasons for Refusal received in the counterpart JP application 2024-535872, mailed on Jun. 10, 2025, 8 pages with English translation.
Lu, Jong-Hong et al., High—Performance, Semitransparent, Easily Tunable Vivid Colorful Perovskite Photovoltaics Featuring Ag/ITO/Ag Microcavity Structures, The Journal of Physical Chemistry C,Feb. 10, 2016, vol. 120, Issue 8, pp. 4233-4239, https://pubs.acs.org/doi/epdf/10.1021/acs.jpcc.5b11144, DOI:10.1021/acs.jpcc.5b11144.
The extended European search report received in the counterpart EP application 22923418.2, mailed on Feb. 17, 2025, 12 pages.
Lu Jong-Hong et al: "High-Performance, Semitransparent, Easily Tunable Vivid Colorful Perovskite Photovoltaics Featuring Ag/ITO/Ag Microcavity Structures", The Journal of Physical Chemistry C, vol. 120, No. 8, Mar. 3, 2016 (Mar. 3, 2016), pp. 4233-4239, XP055876927.
Girtan Mihaela et al: "A review on oxide/metal/oxide thin films on flexible substrates as electrodes for organic and perovskite solar cells", Optical Materials: X, vol. 13, Dec 2, 2021 (Dec. 2, 2021), p. 100122, XP093247100.
Liu Xue-Nan et al: "Optoelectronic properties of an AZO/Ag multilayer employed as a flexible electrode", Ceramics International, Elsevier, Amsterdam, NL, vol. 47, No. 4, Oct. 20, 2020 (Oct. 20, 2020), pp. 5671-5676, XP086440656.
The Request for the Submission of an Opinion received in the counterpart KR application 10-2024-7019455, mailed on June 2, 205, 18 pages with English translation.
Boping Yang et al: "Inorganic top electron transport layer for high performance inverted perovskite solar cells", EcoMat. 2021, 3:e12127, 24 pages.
Notice of Allowance (with English Machine Translation), mailed Jun. 18, 2026, for corresponding Chinese Patent Application Serial No. 202210113364.5.
Tang et al., "Progress on Construction and Application of Composite Copper Nanowires Transparent Electrodes", Materials Reports, vol. 32, Issue 19, 2018, pp. 3423-3434. English Abstract.

* cited by examiner

PEROVSKITE SOLAR CELL, THIN-FILM COMPOSITE ELECTRODE AND PREPARATION METHOD THEREFOR, POWER GENERATING DEVICE, AND POWER CONSUMING DEVICE

CROSS-REFERENCE TO RELATED APPLICATION

The present application is a continuation of International Patent Application No. PCT/CN2022/132720, filed on Nov. 18, 2022, which claims priority to Chinese Patent Application No. 202210113364.5, entitled "PEROVSKITE SOLAR CELL, THIN-FILM COMPOSITE ELECTRODE AND PREPARATION METHOD THEREFOR, POWER GENERATING DEVICE, AND POWER CONSUMING DEVICE" and filed on Jan. 30, 2022, which is incorporated herein by reference in its entirety.

TECHNICAL FIELD

The present invention relates to the technical field of batteries, and in particular to a perovskite solar cell, a thin-film composite electrode and a preparation method therefor, a power generating device, and a power consuming device.

BACKGROUND ART

Perovskite solar cells have attracted widespread attention due to their better performance. Perovskite solar cells in the prior art generally comprise a charge transport layer and a thin-layer electrode adjacent thereto, which is made from a transparent conductive oxide. Since the preparation process of the transparent conductive oxide electrode requires a relatively large amount of energy, which will cause damage to the charge transport layer adjacent thereto, a buffer layer made from molybdenum oxide and other materials is provided between the transparent conductive oxide layer and the charge transport layer. However, the interposing of the buffer layer will reduce the photoelectric conversion efficiency of cells and affect the transparency of the cells.

SUMMARY

In view of the above problems, the present application provides a perovskite solar cell, a thin-film composite electrode and a preparation method therefor, a power generating device and a power consuming device, and can provide a semi-transparent thin-film composite electrode, which enables a perovskite solar cell comprising same to have excellent photoelectric performance while ensuring the transparency thereof, thus being more suitable for practical use.

In a first aspect, the present application provides a perovskite solar cell sequentially comprising transparent conductive glass, a first charge transport layer, a perovskite light-absorbing layer, a second charge transport layer and a thin-film composite electrode, wherein the first charge transport layer is an electron transport layer, and the second charge transport layer is a hole transport layer; alternatively, the first charge transport layer is a hole transport layer, and the second charge transport layer is an electron transport layer; and the thin-film composite electrode comprises: a first metal layer provided on the second charge transport layer; a conductive oxide layer provided on the first metal layer; and a second metal layer provided on the conductive oxide layer.

In the technical solution of an embodiment of the present application, the structural design of the perovskite solar cell can realize a semi-transparent (with a transmittance≥50%) perovskite solar device with a first metal layer-conductive oxide layer-second metal layer as a composite electrode. Here, the thin-film composite electrode has a first metal layer provided on the side in contact with the second charge transport layer, which can further increase the extraction rate of charge carriers at the interface, such that the probability of charge carrier recombination at the interface declines and the non-radiative recombination is reduced, thereby increasing the open-circuit voltage of the device. In addition, a second metal layer is provided on the other side of the conductive oxide layer, which can reduce the overall series resistance of the device, increase the fill factor and finally improve the efficiency of the device.

In some embodiments, the metal of the first metal layer is selected from at least one of gold, silver, copper, aluminum and cobalt, and alloys thereof; and the metal of the second metal layer is selected from at least one of gold, silver, copper, aluminum, nickel, zinc, tin and iron, and alloys thereof. With the material of the first metal layer and the second metal layer being defined, a better energy-level matching of materials can be achieved in the perovskite solar cell, such that the perovskite solar cell can exhibit good conductivity.

In some embodiments, the first charge transport layer is an electron transport layer, and the second charge transport layer is a hole transport layer; and the layers in the perovskite solar cell have an HOMO energy level following an order of the perovskite light-absorbing layer<the second charge transport layer<the first metal layer<the conductive oxide layer<the second metal layer. The perovskite solar cell has a regular device structure, in which the three electrodes, i.e., the first metal layer, the conductive oxide layer and the second metal layer, all have a work function higher than the HOMO energy level of the second charge transport layer. In other words, the work functions of the first metal electrode, the conductive oxide electrode, and the second metal electrode are in a gradually ascending trend, which can ensure the effective transport of charge carriers between the three electrodes. With the above-mentioned technical solution, the photo-excited holes in the perovskite layer in the perovskite solar cell can be successfully conducted to the electrode end.

In some embodiments, the first metal layer has a work function of −5.15 to −4.2 eV; the conductive oxide layer has a work function of −5.10 to −4.1 eV; the second metal layer has a work function of −4.95 to −3.5 eV; and the work function values of the second charge transport layer, the first metal layer, the conductive oxide layer and the second metal layer are in an ascending order; and the absolute value of the difference between the work function values of two adjacent layers is 0.02 eV-0.3 eV. The ranges of the work function of the layers in the thin-film composite electrode are further limited to facilitate the precise selection of the material of the layers in the thin-film electrode, and meanwhile the ranges of the difference between the work function values of the layers are controlled to ensure the successful extraction and transport of photo-generated charge carriers, making it possible to better realize the successful conduction of the photo-excited holes in the perovskite layer to the electrode end.

In some embodiments, the first charge transport layer is a hole transport layer, and the second charge transport layer is an electron transport layer; and the layers in the perovskite solar cell have a LUMO energy level following an order of the perovskite light-absorbing layer>the second charge transport layer>the first metal layer>the conductive oxide layer>the second metal layer. The perovskite solar cell has an inverted device structure, in which the three electrodes, i.e., the first metal layer, the conductive oxide layer and the second metal layer, all have a work function less than the LUMO energy level of the second charge transport layer. In other words, the work functions of the first metal electrode, the conductive oxide electrode, and the second metal electrode are in a gradually descending trend, which can ensure the effective transport of charge carriers between the three electrodes. With the above-mentioned technical solution, the photo-excited electrons in the perovskite layer in the perovskite solar cell can be successfully conducted to the electrode end.

In some embodiments, the first metal layer has a work function of −4.95 to −3.5 eV; the conductive oxide layer has a work function of −5.00 to −3.65 eV; the second metal layer has a work function of −5.30 to −3.75 eV; and the work function values of the second charge transport layer, the first metal layer, the conductive oxide layer and the second metal layer are in a descending order; and the absolute value of the difference between the work function values of two adjacent layers is 0.02 eV-0.3 eV. The ranges of the work function of the layers in the thin-film composite electrode are further limited to facilitate the precise selection of the material of the layers in the thin-film electrode, and meanwhile the ranges of the difference between the work function values of the layers are controlled to ensure the successful extraction and transport of photo-generated charge carriers, making it possible to better realize the successful conduction of the photo-excited electrons in the perovskite layer to the electrode end.

In some embodiments, the conductive oxide layer has a thickness of 50-200 nm; both the first metal layer and the second metal layer have a thickness of 1-10 nm; and the sum of the thickness of the first metal layer and the second metal layer does not exceed 1/10 of the thickness of the conductive oxide layer. The technical solution of controlling the lower limits of the thickness of the layers in the thin-film composite electrode enables the thin-film composite electrode to perform the photoelectric performance thereof; and by controlling the upper limits of the thickness of the layers in the thin-film composite electrode and strictly defining that the sum of the total thickness of the first metal layer and the second metal layer does not exceed 1/10 of the thickness of the conductive oxide layer, it can ensure that the whole thin-film composite electrode is not too thick and the metal layer is relatively thin, thereby avoiding affecting the transparency of the thin-film composite electrode.

In a second aspect, the present application provides a thin-film composite electrode provided on a charge transport layer, and the thin-film composite electrode comprises: a first metal layer provided on the charge transport layer; a conductive oxide layer provided on the first metal layer; and a second metal layer provided on the conductive oxide layer.

In the technical solutions of an embodiment of the present application, the structural design of the thin-film composite electrode can realize a semi-transparent (with a transmittance≥50%) solar cell device without increasing the contact resistance and evaporation temperature of the electrode. The thin-film composite electrode has a first metal layer provided on the side in contact with the charge transport layer, which can further increase the extraction rate of charge carriers at the interface, such that the probability of charge carrier recombination at the interface declines and the non-radiative recombination is reduced, thereby increasing the open-circuit voltage of the device. In addition, a second metal layer is provided on the other side of the conductive oxide layer, which can reduce the overall series resistance of the device, increase the fill factor and finally improve the efficiency of the device.

In some embodiments, the conductive oxide layer has a thickness of 50-200 nm; both the first metal layer and the second metal layer have a thickness of 1-10 nm; and the sum of the thickness of the first metal layer and the second metal layer does not exceed 1/10 of the thickness of the conductive oxide layer. The thickness of the metal electrode will affect the overall transmittance of the device. When the total thickness of the metal electrodes is too large, the transmittance of the device will be greatly reduced, making it unable to meet the application requirements for semi-transparent devices. Further, the metal layers in the thin-film composite electrode are controlled to be thin, and specifically, when the ratio of the total thickness of the metal electrodes to the thickness of the conductive transparent electrode is <1/10, the device appears to be semi-transparent, and the photoelectric conversion efficiency of the thin-film composite electrode will be improved to a certain extent. The technical solution of controlling the lower limits of the thickness of the layers in the thin-film composite electrode enables the thin-film composite electrode to perform the photoelectric performance thereof; and by controlling the upper limits of the thickness of the layers in the thin-film composite electrode and strictly defining that the sum of the total thickness of the first metal layer and the second metal layer does not exceed 1/10 of the thickness of the conductive oxide layer, it can ensure that the whole thin-film composite electrode is not too thick and the metal layer is relatively thin, thereby avoiding affecting the transparency of the thin-film composite electrode.

In some embodiments, the conductive oxide layer has a thickness of 100-150 nm. By further defining the thickness of the conductive oxide layer, it can achieve a better balance between the photoelectric performance and transparency of the thin-film composite electrode, and the thin-film composite electrode will have a conductivity at a better level on the basis of ensuring that the thin-film composite electrode is semi-transparent.

In a third aspect, the present application provides a preparation method of the aforementioned thin-film composite electrode, wherein the thin-film composite electrode is provided on a charge transport layer; and the preparation method comprises the steps of:

1) providing the charge transport layer with a first metal layer;
2) providing the first metal layer with a conductive oxide layer; and
3) providing the conductive oxide layer with a second metal layer.

In the technical solution of an embodiment of the present application, a first metal layer, a conductive oxide layer and a second metal layer are sequentially provided on the charge transport layer to obtain a transparent composite electrode with a structure of metal layer-transparent conductive oxide layer-metal layer.

In some embodiments, the first metal layer is prepared by means of evaporation with a vacuum degree≤$5\times10^{-4}$ Pa, at a temperature≤100 °C and a rate≤0.1 A/s; the conductive oxide layer is prepared by means of vacuum sputtering or vacuum evaporation with a vacuum degree≤$5\times10^{-4}$ Pa at a rate of 0.1 A/s to 1 A/s; the second metal layer is prepared by means of vacuum sputtering or vacuum evaporation with a vacuum degree≤$5\times10^{-4}$ Pa at a rate of 0.1-0.5 A/s; and the preparation method further comprises the steps of: with the vacuum degree being maintained, cooling to room temperature between step 1) and step 2); and carrying out step 2) and step 3) continuously with the vacuum degree being maintained. With the strict definition of the preparation processes of the first metal layer, the conductive oxide layer and the second metal layer, and the strict definitions that the vacuum cannot be broken and the evaporation should be stopped for a period of time between the preparation of the conductive oxide layer and the preparation of the first metal layer and the vacuum cannot be broken between the preparation of the second metal layer and preparation of the conductive oxide layer, a metal-conductive oxide-metal composite electrode required by the technical solution of the present invention is obtained, which appears to be semi-transparent and is not prone to delamination.

In a fourth aspect, the present application provides a power generating device comprising the perovskite solar cell in the above-mentioned embodiment.

In a fifth aspect, the present application provides a power consuming device comprising the aforementioned perovskite solar cell, with the perovskite solar cell being used to supply electrical energy.

The above description is only an overview of the technical solutions of the present application. To more clearly understand the technical means of the present application to implement same according to the contents of the description, and to make the above and other objectives, features, and advantages of the present application more obvious and understandable, specific implementations of the present application are exemplarily described below.

BRIEF DESCRIPTION OF THE DRAWINGS

Various other advantages and benefits will become obvious to those of ordinary skill in the art upon reading the following detailed description of preferred implementations. The accompanying drawings are merely for the purpose of illustrating the preferred implementations, and should not be construed as limiting the present application. Moreover, like components are denoted by like reference signs throughout the accompanying drawings. In the drawings.

Figure 1:
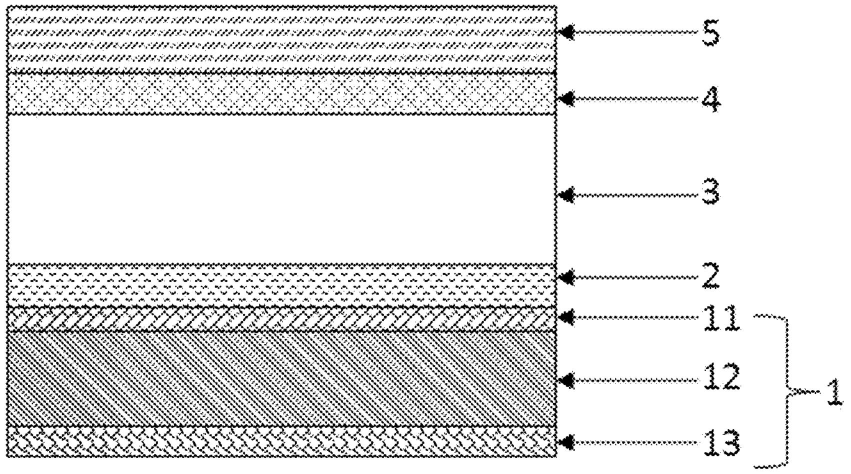
FIG. 1 shows a schematic diagram of the structure of a perovskite solar cell according to some embodiments of the present application.

Reference signs in the Detailed Description of Embodiments:

thin-film composite electrode 1; second charge transport layer 2, perovskite light-absorbing layer 3, first charge transport layer 4, transparent conductive glass 5; first metal layer 11, conductive oxide layer 12, second metal layer 13.

DETAILED DESCRIPTION OF EMBODIMENTS

Embodiments of the technical solutions of the present application will be described in detail below with reference to the accompanying drawings. The following embodiments are merely intended to more clearly illustrate the technical solutions of the present application, so they merely serve as examples, but are not intended to limit the scope of protection of the present application.

Unless otherwise defined, all technical and scientific terms used herein have the same meanings as those commonly understood by those skilled in the art to which the present application belongs. The terms used herein are merely for the purpose of describing specific embodiments, but are not intended to limit the present application. The terms "include/comprise" and "has/have" and any variations thereof in the description and the claims of the present application as well as the brief description of the accompanying drawings described above are intended to cover non-exclusive inclusion.

In the description of the embodiments of the present application, the technical terms "first", "second", etc. are merely used for distinguishing different objects, and are not to be construed as indicating or implying relative importance or implicitly indicating the number, particular order or primary-secondary relationship of the indicated technical features. In the description of the embodiments of the present application, the phrase "multiple" means two or more, unless otherwise explicitly and specifically defined.

The phrase "embodiment" mentioned herein means that the specific features, structures, or characteristics described in conjunction with the embodiment can be encompassed in at least one embodiment of the present application. The phrase at various locations in the description does not necessarily refer to the same embodiment, or an independent or alternative embodiment exclusive of another embodiment. Those skilled in the art understand explicitly or implicitly that the embodiment described herein may be combined with another embodiment.

In the description of the embodiments of the present application, the term "and/or" is merely intended to describe the associated relationship of associated objects, indicating that three relationships can exist. For example, A and/or B can include: only A exists, both A and B exist, and only B exists. In addition, the character "/" herein generally indicates an "or" relationship between the associated objects.

In the description of the embodiments of the present application, the term "multiple" means two or more (including two), similarly the term "multiple groups" means two or more groups (including two groups), and the term "multiple pieces" means two or more pieces (including two pieces).

In the description of the embodiments of the present application, the orientations or positional relationships indicated by the technical terms "central", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential", etc. are based on the orientations or positional relationships shown in the accompanying drawings, are merely intended to facilitate and simplify the description of the embodiments of the present application, rather than indicating or implying that the apparatus or element referred to must have a particular orientation or be constructed and operated in a particular orientation, and therefore cannot be construed as limiting the embodiments of the present application.

In the description of the embodiments of the present application, unless otherwise explicitly specified and defined, the technical terms such as "mount", "couple", "connect", and "fix" should be understood in a broad sense. For example, they may be a fixed connection, a detachable connection, or an integrated connection; may be a mechanical connection or an electric connection; and may be a direct connection or an indirect connection by means of an intermediate medium, or may be communication between interiors of two elements or interaction between the two elements. For those of ordinary skill in the art, the specific meanings of the above terms in the embodiments of the present application can be understood according to specific situations.

In the prior art, perovskite solar cells have attracted widespread attentions due to their better performance. However, the perovskite solar cells in the prior art generally comprise a charge transport layer and a thin-layer electrode adjacent thereto, which is made from a transparent conductive oxide. Since the preparation process of the transparent conductive oxide electrode requires a relatively large amount of energy, which will cause damage to the charge transport layer adjacent thereto, a buffer layer made from molybdenum oxide and other materials needs to be provided between the transparent conductive oxide layer and the charge transport layer.

The inventors noticed that providing a buffer layer between the charge transport layer and the electrode layer may result in the decrease of the photoelectric conversion efficiency of cells and affect the transparency of the cells.

In order to solve the above-mentioned problems, the applicant has found through research that a semi-transparent thin-film composite electrode can be obtained by providing a first metal layer on the surface of a charge transport layer, then providing a conductive oxide layer on the first metal layer, and finally providing a second metal layer on the conductive oxide layer, which enables the semi-transparent thin-film composite electrode to have a relatively high photoelectric conversion efficiency while ensuring the transparency thereof.

The thin-film composite electrode disclosed in an embodiment of the present application can be applied to a perovskite solar cell sequentially comprising transparent conductive glass, a first charge transport layer, a perovskite light-absorbing layer, a second charge transport layer and a thin-film composite electrode; wherein the first charge transport layer is an electron transport layer, and the second charge transport layer is a hole transport layer; alternatively, the first charge transport layer is a hole transport layer, and the second charge transport layer is an electron transport layer; and the thin-film composite electrode comprises: a first metal layer provided on the second charge transport layer; a conductive oxide layer provided on the first metal layer; and a second metal layer provided on the conductive oxide layer. With the above-mentioned technical solution, a semi-transparent perovskite solar device with a first metal layer-conductive oxide layer-second metal layer as a composite electrode can be obtained, which has not only a certain degree of transparency but also good photoelectric conversion efficiency.

When preparing the thin-film composite electrode disclosed in an embodiment of the present application, the thin-film composite electrode is provided on a charge transport layer; and the preparation method comprises the steps of: 1) providing the charge transport layer with a first metal layer; 2) providing the first metal layer with a conductive oxide layer; and 3) providing the conductive oxide layer with a second metal layer. With the above-mentioned technical solution, a transparent composite electrode with a structure of metal layer-transparent conductive oxide layer-metal layer can be obtained. The thin-film composite electrode can have a relatively high photoelectric conversion efficiency while ensuring the transparency thereof.

The perovskite solar cells disclosed in an embodiment of the present application can be applied in a power generating device, which can ensure the transparency of the power generating device and also enable same to have a relatively high photoelectric conversion efficiency, thus being applicable to application situations requiring both transparency and conductivity.

The perovskite solar cell disclosed in an embodiment of the present application can be applied in the cell of a power consuming device. The power consuming device comprises the aforementioned perovskite solar cell, which is used to supply electrical energy and can be used in application situations requiring both transparency and conductivity.

For the convenience of explanation, the following embodiments will be described with a thin-film composite electrode and a perovskite solar cell of an embodiment of the present application as examples.

Reference can be made to FIG. 1, which shows a schematic diagram of a perovskite solar cell according to some embodiments of the present application. As shown in FIG. 1, the perovskite solar cell has a layered structure and comprises transparent conductive glass 5, a first charge transport layer 4, a perovskite light-absorbing layer 3, a second charge transport layer 2 and a thin-film composite electrode 1 that are provided sequentially; wherein the first charge transport layer 4 is an electron transport layer, and the second charge transport layer 2 is a hole transport layer; alternatively, the first charge transport layer 4 is a hole transport layer, and the second charge transport layer 2 is an electron transport layer; and the thin-film composite electrode 1 comprises: a first metal layer 11 provided on the second charge transport layer 2; a conductive oxide layer 12 provided on the first metal layer 11; and a second metal layer 13 provided on the conductive oxide layer 12.

Figure 2:
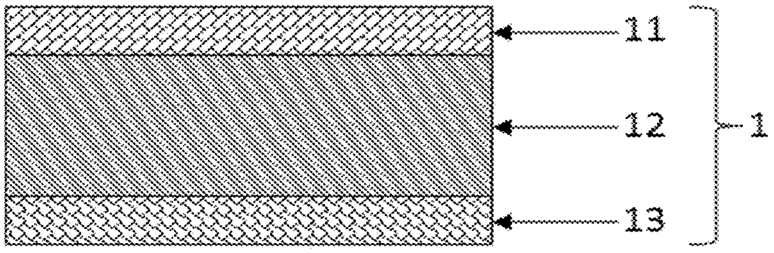
FIG. 2 shows a schematic diagram of a thin-film composite electrode according to some embodiments of the present application.

Reference can be made to FIG. 2, which is a schematic diagram of the structure of a thin-film composite electrode provided in some embodiments of the present application. As shown in FIG. 2, the thin-film composite electrode has a three-layer structure, in which a conductive oxide layer is sandwiched between metal layers, forming a thin-film composite electrode composed of three layers of films of metal layer-conductive oxide layer-metal layer. When the thin-film composite electrode is used, one of the metal layers is provided on a charge transport layer.

According to some embodiments of the present application, the present application provides a thin-film composite electrode provided on a charge transport layer. The thin-film composite electrode comprises: a first metal layer provided on the charge transport layer; a conductive oxide layer provided on the first metal layer; and a second metal layer provided on the conductive oxide layer.

The structural design of the thin-film composite electrode can realize a semi-transparent solar cell device without increasing the contact resistance and evaporation temperature of the electrode. The thin-film composite electrode has a first metal layer provided on the side in contact with the charge transport layer, which can further increase the extraction rate of charge carriers at the interface, such that the probability of charge carrier recombination at the interface declines and the non-radiative recombination is reduced, thereby increasing the open-circuit voltage of the device. In addition, a second metal layer is provided on the other side of the conductive oxide layer, which can reduce the overall series resistance of the device, increase the fill factor and finally improve the efficiency of the device.

According to some embodiments of the present application, it is preferred that the thin-film composite electrode is directly provided on a charge transport layer, the thin-film composite electrode comprising: a first metal layer directly provided on the charge transport layer; a conductive oxide layer directly provided on the first metal layer; and a second metal layer directly provided on the conductive oxide layer.

According to some embodiments of the present application, it is preferred that modification layers are provided between the charge transport layer, the first metal layer, the conductive oxide layer and the second metal layer.

According to some embodiments of the present application, the metal of the first metal layer is selected from at least one of gold, silver, copper, aluminum and cobalt, and alloys thereof; the material of the conductive oxide layer is at least one of tin-doped indium oxide, tungsten-doped indium oxide, fluorine-doped tin oxide, aluminum-doped zinc oxide, indium zinc oxide and zinc tin oxide; and the metal of the second metal layer is selected from at least one of gold, silver, copper, aluminum, nickel, zinc, tin and iron, and alloys thereof.

According to some embodiments of the present application, it is preferred that the conductive oxide layer has a thickness of 50-200 nm; both the first metal layer and the second metal layer have a thickness of 1-10 nm; and the sum of the thickness of the first metal layer and the second metal layer does not exceed 1/10 of the thickness of the conductive oxide layer. The thickness of the metal electrode will affect the overall transmittance of the device. When the total thickness of the metal electrodes is too large, the transmittance of the device will be greatly reduced, making it unable to meet the application requirements for semi-transparent devices. Further, the metal layers in the thin-film composite electrode are controlled to be thin, and specifically, when the ratio of the total thickness of the metal electrodes to the thickness of the conductive transparent electrode is <1/10, the device appears to be semi-transparent, and the photoelectric conversion efficiency of the thin-film composite electrode will be improved to a certain extent. The technical solution of controlling the lower limits of the thickness of the layers in the thin-film composite electrode enables the thin-film composite electrode to perform the photoelectric performance thereof; and by controlling the upper limits of the thickness of the layers in the thin-film composite electrode and strictly defining that the sum of the total thickness of the first metal layer and the second metal layer does not exceed 1/10 of the thickness of the conductive oxide layer, it can ensure that the whole thin-film composite electrode is not too thick and the metal layer is relatively thin, thereby avoiding affecting the transparency of the thin-film composite electrode.

According to some embodiments of the present application, it is preferred that the conductive oxide layer has a thickness of 100-150 nm. By further defining the thickness of the conductive oxide layer, it can achieve a better balance between the photoelectric performance and transparency of the thin-film composite electrode, and the thin-film composite electrode will have a conductivity at a better level on the basis of ensuring that the thin-film composite electrode is semi-transparent.

According to some embodiments of the present application, the present application provides a perovskite solar cell sequentially comprising transparent conductive glass, a first charge transport layer, a perovskite light-absorbing layer, a second charge transport layer and a thin-film composite electrode; wherein the first charge transport layer is an electron transport layer, and the second charge transport layer is a hole transport layer; alternatively, the first charge transport layer is a hole transport layer, and the second charge transport layer is an electron transport layer; and the thin-film composite electrode comprises: a first metal layer provided on the second charge transport layer; a conductive oxide layer provided on the first metal layer; and a second metal layer provided on the conductive oxide layer.

The structural design of the perovskite solar cell can realize a semi-transparent perovskite solar device with a first metal layer-conductive oxide layer-second metal layer as a composite electrode.

According to some embodiments of the present application, it is preferred that the first metal layer is directly provided on the second charge transport layer, the conductive oxide layer is directly provided on the first metal layer, and the second metal layer is directly provided on the conductive oxide layer.

According to some embodiments of the present application, it is preferred that corresponding modification layers can be interposed between every two layers of the transparent conductive glass, the first charge transport layer, the perovskite light-absorbing layer, the second charge transport layer, and the thin-film composite electrode layer, so as to improve the performance of the perovskite solar cell. The transparent conductive glass is the light incident surface of the perovskite solar cell.

According to some embodiments of the present application, it is preferred that the metal of the first metal layer is selected from at least one of gold, silver, copper, aluminum and cobalt, and alloys thereof; the metal of the second metal layer is selected from at least one of gold, silver, copper, aluminum, nickel, zinc, tin and iron, and alloys thereof. With the material of the first metal layer and the second metal layer being defined, a better energy-level matching of materials can be achieved in the perovskite solar cell, such that the perovskite solar cell can exhibit good conductivity.

According to some embodiments of the present application, it is preferred that the first charge transport layer is an electron transport layer, and the second charge transport layer is a hole transport layer; and the layers in the perovskite solar cell have an HOMO energy level following an order of the perovskite light-absorbing layer<the second charge transport layer<the first metal layer<the conductive oxide layer<the second metal layer. The perovskite solar cell has a regular device structure, in which the three electrodes, i.e., the first metal layer, the conductive oxide layer and the second metal layer, all have a work function higher than the HOMO energy level of the second charge transport layer. In other words, the work functions of the first metal electrode, the conductive oxide electrode, and the second metal electrode are in a gradually ascending trend, which can ensure the effective transport of charge carriers between the three electrodes. With the above-mentioned technical solution, the photo-excited holes in the perovskite layer in the perovskite solar cell can be successfully conducted to the electrode end.

According to some embodiments of the present application, it is preferred that the first metal layer has a work function of −5.15 to −4.2 eV; the conductive oxide layer has a work function of −5.10 to −4.1 eV; the second metal layer has a work function of −4.95 to −3.5 eV; and the work function values of the second charge transport layer, the first metal layer, the conductive oxide layer and the second metal layer are in an ascending order; and the absolute value of the difference between the work function values of two adjacent layers is 0.02 eV−0.3 eV. The ranges of the work function of the layers in the thin-film composite electrode are further limited to facilitate the precise selection of the material of the layers in the thin-film electrode, and meanwhile the ranges of the difference between the work function values of the layers are controlled to ensure the successful extraction and transport of photo-generated charge carriers, making it possible to better realize the successful conduction of the photo-excited holes in the perovskite layer to the electrode end.

According to some embodiments of the present application, it is preferred that the first charge transport layer is a hole transport layer, and the second charge transport layer is an electron transport layer; and the layers in the perovskite solar cell have a LUMO energy level following an order of the perovskite light-absorbing layer>the second charge transport layer>the first metal layer>the conductive oxide layer>the second metal layer. The perovskite solar cell has an inverted device structure, in which the three electrodes, i.e., the first metal layer, the conductive oxide layer and the second metal layer, all have a work function less than the LUMO energy level of the second charge transport layer. In other words, the work functions of the first metal electrode, the conductive oxide electrode, and the second metal electrode are in a gradually descending trend, which can ensure the effective transport of charge carriers between the three electrodes. With the above-mentioned technical solution, the photo-excited electrons in the perovskite layer in the perovskite solar cell can be successfully conducted to the electrode end.

According to some embodiments of the present application, it is preferred that the first metal layer has a work function of −4.95 to −3.5 eV; the conductive oxide layer has a work function of −5.00 to −3.65 eV; the second metal layer has a work function of −5.30 to −3.75 eV; and the work function values of the second charge transport layer, the first metal layer, the conductive oxide layer and the second metal layer are in a descending order; and the absolute value of the difference between the work function values of two adjacent layers is 0.02 eV−0.3 eV. The ranges of the work function of the layers in the thin-film composite electrode are further limited to facilitate the precise selection of the material of the layers in the thin-film electrode, and meanwhile the ranges of the difference between the work function values of the layers are controlled to ensure the successful extraction and transport of photo-generated charge carriers, making it possible to better realize the successful conduction of the photo-excited electrons in the perovskite layer to the electrode end.

The term HOMO mentioned above is the abbreviation of Highest Occupied Molecular Orbital. The term LUMO mentioned above is the abbreviation of Lowest Unoccupied Molecular Orbital. The energy difference between the HOMO and LUMO is called “energy band gap”, that is the so-called HOMO-LUMO energy level, which can sometimes be used to measure whether a molecule will be easily excited. A smaller band gap indicates an easier molecule excitation. The HOMO in organic semiconductors and quantum dots is similar to the valence band in inorganic semiconductors, while the LUMO is similar to the conduction band. The HOMO energy level refers to the valence band maximum (VBM). The LUMO energy level refers to the conduction band minimum (CBM).

For semiconductors, the work function refers to the minimum energy required for an electron to immediately escape from a solid, which is an inherent characteristic and intrinsic feature of a material itself. In the thin-film composite electrode, it is necessary to maintain a difference between the energy levels of two adjacent layers. When the absolute value of the energy level difference is less than 0.02 eV, the built-in electrical field of the electrode cannot be formed, making it impossible for charges to transfer in a certain direction; and when the absolute value of the energy level difference is greater than 0.3 eV, it will cause significant open-circuit voltage loss, which is not conducive to improving the performance of the device.

According to some embodiments of the present application, it is preferred that the conductive oxide layer has a thickness of 50-200 nm; both the first metal layer and the second metal layer have a thickness of 1-10 nm; and the sum of the thickness of the first metal layer and the second metal layer does not exceed 1/10 of the thickness of the conductive oxide layer. The technical solution of controlling the lower limits of the thickness of the layers in the thin-film composite electrode enables the thin-film composite electrode to perform the photoelectric performance thereof; and by controlling the upper limits of the thickness of the layers in the thin-film composite electrode and strictly defining that the sum of the total thickness of the first metal layer and the second metal layer does not exceed 1/10 of the thickness of the conductive oxide layer, it can ensure that the whole thin-film composite electrode is not too thick and the metal layer is relatively thin, thereby avoiding affecting the transparency of the thin-film composite electrode.

According to some embodiments of the present application, the perovskite solar cell is a semi-transparent cell. This is because, on the one hand, the total thickness of the perovskite solar cell is 52-220 nm, and meanwhile, it is particularly defined that the sum of the thickness of the first metal layer and the second metal layer does not exceed 1/10 of the thickness of the conductive oxide layer, that is the maximum of the sum of the thickness of the metal layers in the thin-film composite electrode of the present invention does not exceed 20 nm; therefore, the transparency of the conductive oxide layer is not greatly affected, making the perovskite solar cell have a property of being semi-transparent and be applicable in glass devices.

According to some embodiments of the present application, the material of the transparent conductive glass is selected from at least one of fluorine-doped indium oxide, indium-doped tin oxide, aluminum-doped zinc oxide, beryllium-doped zinc oxide, and indium-doped zinc oxide.

According to some embodiments of the present application, the chemical formula of the perovskite light-absorbing layer is $ABX_3$ or $A_2CDX_6$, where A represents a positively monovalent inorganic cation and/or organic cation, B represents a positively divalent metal cation, C represents a positively monovalent metal cation, D represents a positively trivalent metal cation, and X is an inorganic anion and/or organic anion.

According to some embodiments of the present application, the positively divalent metal cation is a lead ion or a tin ion.

According to some embodiments of the present application, the perovskite light-absorbing layer has a band gap of 1.20-2.30 eV and a thickness of 200-1000 nm.

According to some embodiments of the present application, the electron transport layer is selected from at least one of methyl [6,6]-phenyl-$C_{61}$-butyrate, methyl [6,6]-phenyl-$C_{71}$-butyrate, fullerene C60, fullerene C70, tin dioxide and zinc oxide, and derivatives of the above materials, or materials modified by means of doping or passivating the above materials.

According to some embodiments of the present application, the hole transport layer is selected from at least one of 2,2',7,7'-tetra(N,N-p-methoxyphenylamino)-9,9'-spirodifluorene, poly[bis(4-phenyl) (2,4,6-trimethylphenyl)amine], methoxytriphenylamine-fluoroformamidine, poly(3,4-ethylenedioxythiophene):poly(styrenesulfonate), poly(3-hexylthiophene), cuprous thiocyanate, nickel oxide, triptycene-cored triphenylamine, 3,4-ethylenedioxythiophene-methoxytriphenylamine, N-(4-aniline) carbazole-spirobifluorene (CzPAF-SBF) and polythiophene, and derivatives of the above materials, or materials modified by means of doping or passivating the above materials.

According to some embodiments of the present application, the material of the conductive oxide layer is at least one of tin-doped indium oxide, tungsten-doped indium oxide, fluorine-doped tin oxide, aluminum-doped zinc oxide, indium zinc oxide, and zinc tin oxide.

According to some embodiments of the present application, the present application provides a preparation method of the aforementioned thin-film composite electrode, wherein the thin-film composite electrode is provided on a charge transport layer; and the preparation method comprises the steps of:

1) providing the charge transport layer with a first metal layer;
2) providing the first metal layer with a conductive oxide layer; and
3) providing the conductive oxide layer with a second metal layer.

In the technical solution of an embodiment of the present application, a first metal layer, a conductive oxide layer and a second metal layer are sequentially provided on the charge transport layer to obtain a transparent composite electrode with a structure of metal layer-transparent conductive oxide layer-metal layer.

According to some embodiments of the present application, it is preferred that the first metal layer is prepared by means of evaporation with a vacuum degree≤$5\times10^{-4}$ Pa, at a temperature≤100 °C and a rate≤0.1 A/s; the conductive oxide layer is prepared by means of vacuum sputtering or vacuum evaporation with a vacuum degree≤$5\times10^{-4}$ Pa at a rate of 0.1 A/s to 1 A/s; the second metal layer is prepared by means of vacuum sputtering or vacuum evaporation with a vacuum degree≤$5\times10^{-4}$ Pa at a rate of 0.1-0.5 A/s; and the preparation method further comprises the steps of: with the vacuum degree being maintained, cooling to room temperature between step 1) and step 2); and carrying out step 2) and step 3) continuously with the vacuum degree being maintained. With the strict definition of the preparation processes of the first metal layer, the conductive oxide layer and the second metal layer, and the strict definitions that the vacuum cannot be broken and the evaporation should be stopped for a period of time between the preparation of the conductive oxide layer and the preparation of the first metal layer and the vacuum cannot be broken between the preparation of the second metal layer and preparation of the conductive oxide layer, a metal-conductive oxide-metal composite electrode required by the technical solution of the present invention is obtained, which appears to be semi-transparent and is not prone to delamination.

The present application will be further described below with reference to specific embodiments.

Performance Test of Perovskite Solar Cells

The performance of the cells is tested under irradiation with standard simulated sunlight (AM 1.5 G, 100 mW/$cm^2$), so as to obtain an I-V curve.

On the basis of the I-V curve and the data from the test apparatus, the short-circuit current Jsc (in mA), open-circuit voltage Voc (in V), maximum light-generated current Jmpp (in mA) and maximum light-generated voltage Vmpp (in V) can be obtained.

The fill factor FF (in %) of a cell is calculated according to the formula FF=Jsc×Voc/(Jmpp×Vmpp).

The photoelectrical conversion efficiency PCE (in %) of a cell is calculated according to the formula PCE=Jsc×Voc×FF/Pw, where Pw represents input power (in mW).

For the convenience of performance comparison, the present invention normalizes parameters such as short-circuit current, open-circuit voltage, fill factor and photoelectrical conversion efficiency with the numerical values of the comparative example corresponding to each example as a standard, which can allow the intuitive comparison of devices regarding their parameters and performance improvements.

Example 1

An ITO (indium tin oxide) conductive glass with a size of 2.0 cm×2.0 cm was used, with no limitation on the thickness thereof. The ITO layers with a width of 0.35 cm on both opposite sides of an ITO-layer-coated glass were removed by means of a laser etching method, exposing the glass substrate.

The etched ITO conductive glass was ultrasonically washed with water, acetone and isopropanol in order, which was repeated at least twice.

The residual solvent on the surface of the ITO conductive glass was blow-dried with a nitrogen spray gun, and then the ITO conductive glass was placed into an ultraviolet ozone machine for further washing. The washing was carried out for 5-30 min, with no specific limitation.

A solution of PTAA (poly[bis(4-phenyl) (2,4,6-trimethylphenyl)amine]) in isopropanol was prepared, with a concentration in mass/volume percent of 2 mg/mL, that is 2 mg of the solute was dissolved per milliliter of the solvent.

The PTAA solution prepared above was spin-coated onto the ITO conductive glass substrate that had been treated in the ultraviolet ozone machine at a rate of 5,000 rpm/s, followed by an annealing treatment for 10 min on a 100 °C heating platform. The PTAA layer was an organic hole transport layer.

A perovskite precursor solution was spin-coated onto the organic hole transport layer prepared above at a rate of 1,000-5,000 rpm/s, followed by annealing at 100 °C for 30 min and cooling to room temperature. Here, the active matter of the perovskite light-absorbing layer was CsFAMA, with the specific composition being $Cs_{0.05}(FA_{0.85}MA_{0.15})_{0.95}PbI_{0.93}Br_{0.07}$, and the concentration thereof was 1.4 mol/L; the solvent was a mixture of DMF (dimethylformamide) and DMSO (dimethyl sulfoxide) in a volume ratio of 4:1; and the CsFAMA layer was the perovskite layer.

$PC_{61}BM$ (methyl [6,6]-phenyl-$C_{61}$-butyrate) was spin-coated onto the perovskite layer prepared above at a rate of 1,000-1,500 rpm/s, followed by annealing at 100 °C for 10 min. Then BCP (bathocuproine) was immediately spin-coated at a rate of 5,000 rpm/s. Here, the concentration in mass/volume percent of $PC_{61}BM$ was 20 mg/mL, that is 20 mg of the solute was dissolved per milliliter of a solvent; the solvent was chlorobenzene; the concentration in mass/volume percent of BCP was 0.5 mg/mL, that is 0.5 mg of the solute was dissolved per milliliter of a solvent; the solvent was isopropanol; the $PC_{61}BM$ layer was an electron transport layer; the BCP layer was a passivation layer; and the second charge transport layer has a work function of −4.40 eV.

The sheet prepared above was placed into an evaporation machine. When the vacuum degree of evaporation was $5\times10^{4}$ Pa or less, a metal electrode of Cu (with a work function of −4.65 eV) with a thickness of 2 nm was evaporated at a rate of 0.1 A/s at an evaporation temperature of 30-50 °C With the vacuum degree being maintained without break off, cooling was performed until reaching room temperature. Then, a tin-doped indium oxide, a transparent conductive oxide, was sputtered by means of a radio-frequency magnetron sputtering method to form a conductive oxide thin film with a thickness of 100 nm. The tin-doped indium oxide had a work function of −4.85 eV. Finally, with the vacuum degree being maintained without break off, the tin-doped indium oxide transparent conductive oxide film was plated with a metal electrode of Au (with a work function of −5.1 eV) with a thickness of 5 nm at a rate of 0.2 A/s by means of evaporation or sputtering, so as to form a complete composite thin-film electrode.

Figure 3:
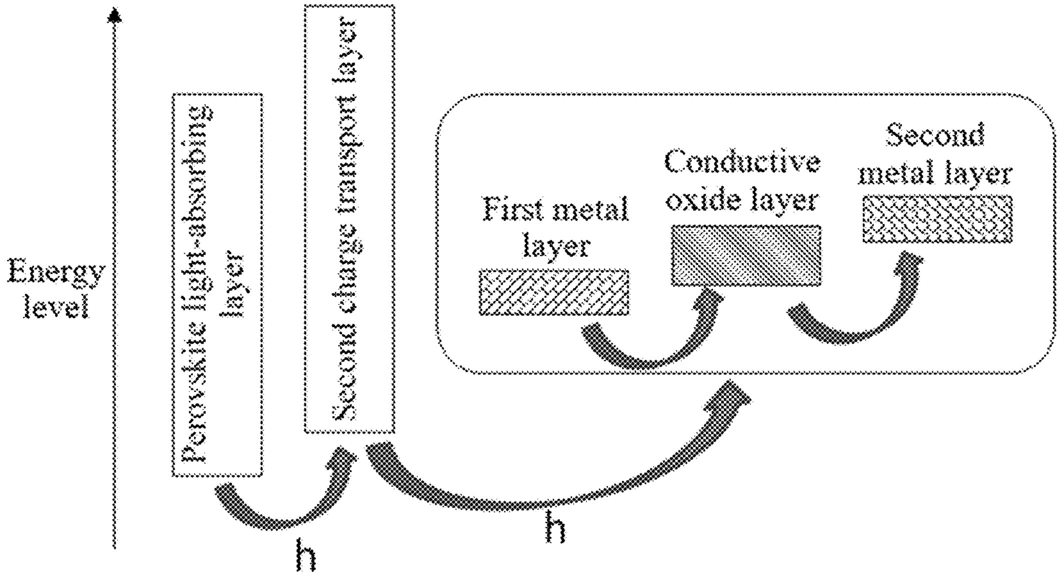
FIG. 3 shows a schematic diagram of the energy level of a regular perovskite solar cell device according to some embodiments of the present application.

The perovskite solar cell obtained by the steps above was marked as cell 1#, and the schematic diagram of the energy levels of the perovskite light-absorbing layer, the second charge transport layer, the first metal layer, the conductive oxide layer and the second metal layer in the cell 1# were shown in FIG. 3. The photoelectrical performance results of the cell 1# were shown in Table 1, and the transparency data thereof were as shown in Table 2.

Example 2

An ITO (indium tin oxide) conductive glass with a size of 2.0 cm×2.0 cm was used, with no limitation on the thickness thereof. The ITO layers with a width of 0.35 cm on both opposite sides of a ITO-layer-coated glass were removed by means of a laser etching method, exposing the glass substrate.

The etched ITO conductive glass was ultrasonically washed with water, acetone and isopropanol in order, which was repeated at least twice.

The residual solvent on the surface of the ITO conductive glass was blow-dried with a nitrogen spray gun, and then the ITO conductive glass was placed into an ultraviolet ozone machine for further washing. The washing was carried out for 5-30 min, with no specific limitation.

A commercially-available aqueous $SnO_2$ (tin dioxide) solution (alfa), a 15% hydrocolloid dispersion solution, was purchased and diluted with 3 times distilled water for later use.

The ITO conductive glass substrate that had been treated in the ultraviolet ozone machine was spin-coated with the above diluted aqueous $SnO_2$ solution at a rotation speed of 4,000 rpm/s with acceleration of 2,000 rpm/$s^2$, and then heated at 150 °C for 15 min. The $SnO_2$ layer was an electron transport layer.

The electron transport layer prepared above was spin-coated with a perovskite precursor solution at a rate of 1,000-4,000 rpm/s, followed by annealing at 100 °C for 30 min and cooling to room temperature. Here, the active matter of the perovskite light-absorbing layer was CsFAMA, with the specific composition being $Cs_{0.05}(FA_{0.85}MA_{0.15})_{0.95}PbI_{0.93}Br_{0.07}$, and the concentration thereof was 1.4 mol/L; the solvent was a mixture of DMF (dimethylformamide) and DMSO (dimethyl sulfoxide) in a volume ratio of 4:1; and the CsFAMA layer was the perovskite layer.

The perovskite layer prepared above was spin-coated with a hole transport layer of Spiro-OMeTAD (2,2',7,7'-tetra[N,N-di(4-methoxyphenyl)amino]-9,9'-spirodifluorene) at a rate of 3,000 rpm/s, with the solvent being chlorobenzene, and the concentration in mass/volume percent being 72.3 mg/mL, that is 72.3 mg of the solute was dissolved per milliliter of the solvent. The hole transport layer had a work function of −5.15 eV.

The sheet prepared above was placed into an evaporation machine. When the vacuum degree of evaporation was $5\times10^{-4}$ Pa or less, a metal electrode of Au (with a work function of −5.1 eV) with a thickness of 2 nm was evaporated at a rate of 0.1 A/s at an evaporation temperature of 30-50 °C With the vacuum degree being maintained without break off, cooling was performed until reaching room temperature. Then, a tin-doped indium oxide, a transparent conductive oxide, was sputtered by means of a radio-frequency magnetron sputtering method to form a conductive oxide thin film with a thickness of 100 nm. The tin-doped indium oxide had a work function of −4.85 eV. Finally, with the vacuum degree being maintained without break off, the tin-doped indium oxide transparent conductive oxide film was plated with a metal electrode of Ag (with a work function of −4.6 eV) with a thickness of 5 nm at a rate of 0.2 A/s by means of evaporation or sputtering, so as to form a complete composite thin-film electrode.

Figure 4:
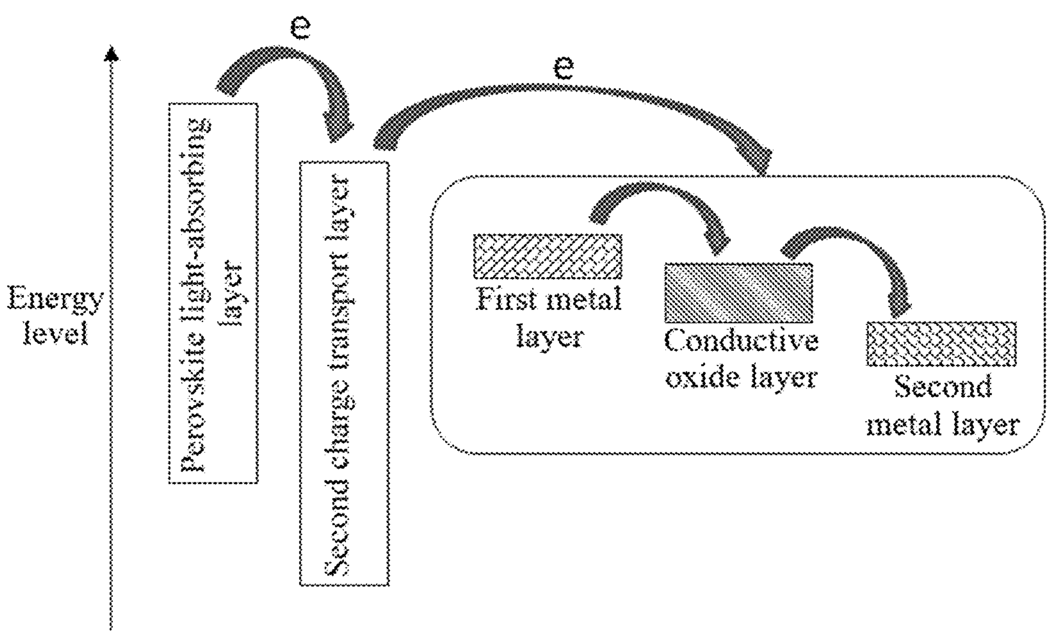
FIG. 4 shows a schematic diagram of the energy level of an inverted perovskite solar cell device according to some embodiments of the present application.
Figure 5:
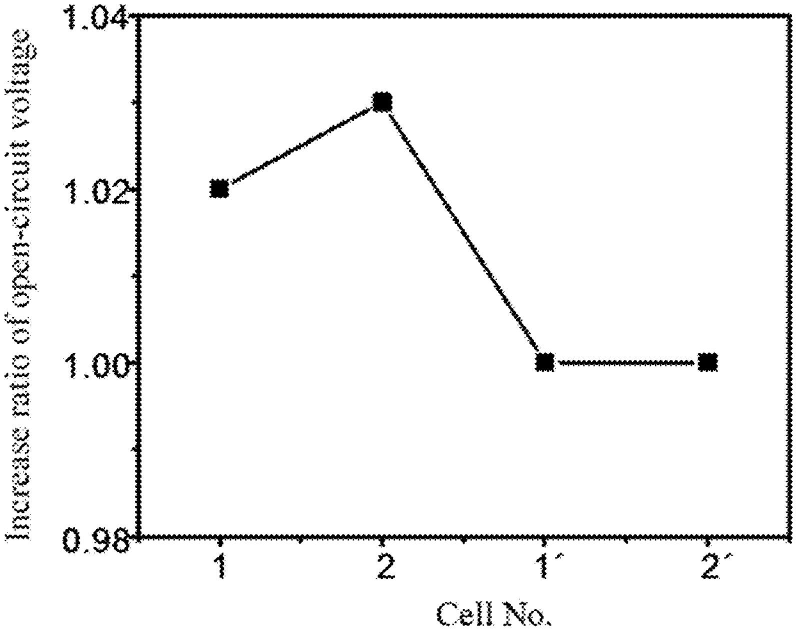
FIG. 5 shows a performance graph of the open-circuit voltage of a perovskite solar cell according to some embodiments of the present application.
Figure 6:
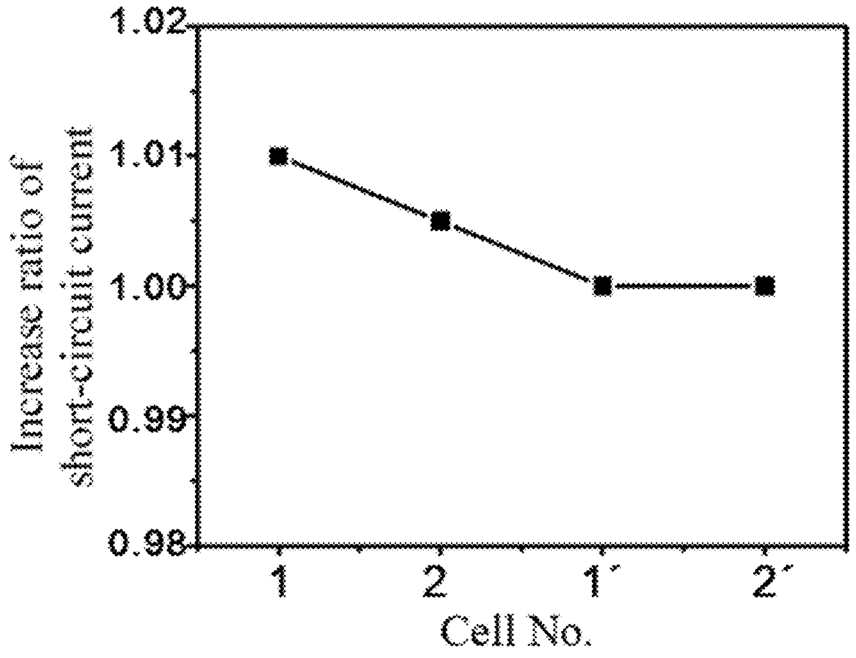
FIG. 6 shows a performance graph of the short-circuit current of a perovskite solar cell according to some embodiments of the present application.
Figure 7:
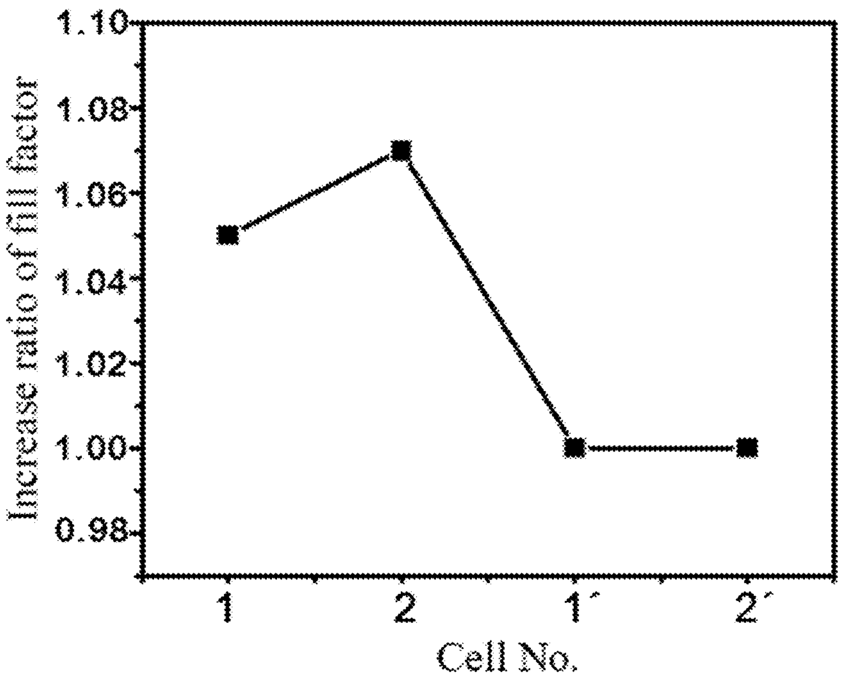
FIG. 7 shows a performance graph of the fill factor of a perovskite solar cell according to some embodiments of the present application.
Figure 8:
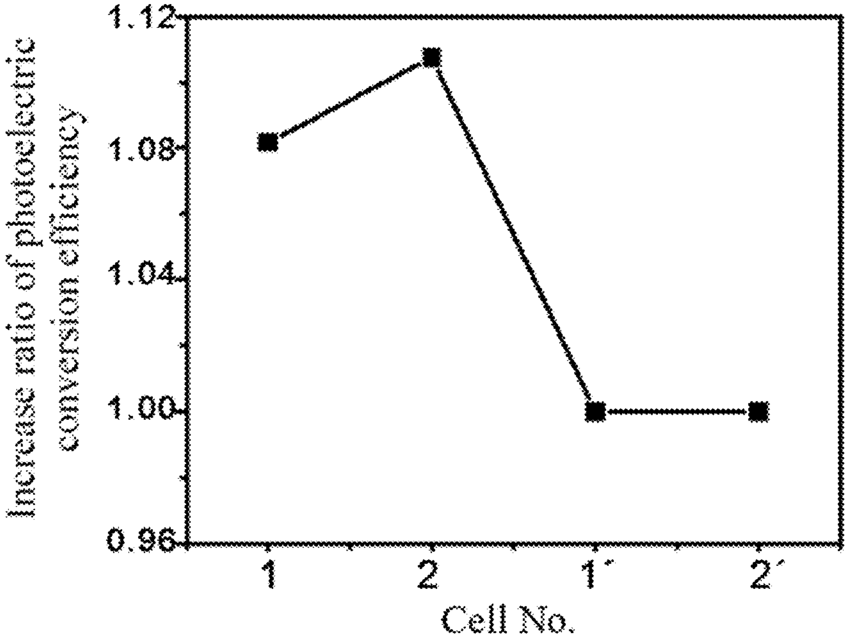
FIG. 8 shows a performance graph of the photoelectric conversion efficiency of a perovskite solar cell according to some embodiments of the present application.

The perovskite solar cell obtained by the steps above was marked as cell 2#, and the schematic diagram of the energy levels of the perovskite light-absorbing layer, the second charge transport layer, the first metal layer, the conductive oxide layer and the second metal layer in the cell 2# were shown in FIG. 4. The photoelectrical performance results of the cell 2# were shown in Table 1, and the transparency data thereof were as shown in Table 2.

Example 3

The preparation process was the same as that in example 2, where the first metal layer was a cobalt layer (with a work function of −5.0 eV) with a thickness of 2 nm, the conductive oxide layer was a tin-doped indium oxide layer (with a work function of −4.85 eV) with a thickness of 100 nm, and the second metal layer was a nickel layer (with a work function of −4.6 eV) with a thickness of 5 nm. The photoelectrical performance results of the cell obtained in this example were as shown in Table 1, and the transparency data were as shown in Table 2.

Examples 4 to 7

The preparation process was the same as that in example 2. The materials of the metal layers and the thickness data of the layers were as shown in Table 3. The photoelectrical performance results of the obtained cell were as shown in Table 1, and the transparency data were as shown in Table 2.

Comparative Example 1

The preparation process was the same as that in example 1, with the only exception that when the electrode part was finally prepared, first, a 10 nm thick molybdenum oxide was thermally evaporated, which served as a buffer layer in the magnetron sputtering process, and then a 107 nm tin-doped indium oxide layer was directly sputtered, with the work function of the tin-doped indium oxide being −4.85 eV. The obtained perovskite solar cell was marked as cell 1'#. The transparency data of the cell 1'# was as shown in Table 3, and the photoelectrical performances thereof were all normalized.

Comparative Example 2

The preparation process was the same as that in example 2, with the only exception that when the electrode part was finally prepared, first, a 10 nm thick molybdenum oxide was thermally evaporated, which served as a buffer layer in the magnetron sputtering process, and then a 107 nm thick tin-doped indium oxide layer was directly sputtered, with the work function of the tin-doped indium oxide being −4.85 eV. The obtained perovskite solar cell was marked as cell 2'#. The transparency data of the cell 2'# was as shown in Table 3, and the photoelectrical performances thereof were all normalized.

The photoelectrical performance results of the cell 1#, cell 2#, cell 1'# and cell 2'# were as shown in FIG. 5 to FIG. 8.

Comparative Examples 3-7

The preparation processes were the same as those in examples 3-7, with the only exception that when the electrode part was finally prepared, first, a 10 nm thick molybdenum oxide was thermally evaporated, which served as a buffer layer in the magnetron sputtering process, and then a tin-doped indium oxide layer was directly sputtered, with the work function of the tin-doped indium oxide being −4.85 eV; and the thickness of the conductive oxide layers was the same as the total thickness of the "metal layer-conductive oxide layer-metal layer" in examples 3-7 respectively. The transparency data of the obtained perovskite solar cells were as shown in Table 2, and the photoelectrical performances thereof were all normalized.

TABLE 1

| | Increase ratio of open-circuit voltage | Increase ratio of short-circuit current | Increase ratio of fill factor | Increase ratio of photoelectrical conversion efficiency |
|---|---|---|---|---|
| Example 1 | 2.0% | 1.0% | 5.0% | 8.0% |
| Example 2 | 3.0% | 0.6% | 7.0% | 10.0% |
| Example 3 | 2.2% | 0.3% | 3.0% | 5.0% |
| Example 4 | 0.5% | 0.9% | 3.0% | 4.1% |
| Example 5 | 0.1% | 0.3% | 1.3% | 2.1% |
| Example 6 | 0.7% | 0.6% | 2.0% | 3.2% |
| Example 7 | 1.2% | 1.4% | 5.0% | 7.1% |

TABLE 2

| | Transmittance | | Transmittance |
|---|---|---|---|
| Example 1 | 58.3% | Comparative example 1 | 57.1% |
| Example 2 | 56.1% | Comparative example 2 | 54.3% |
| Example 3 | 55.7% | Comparative example 3 | 54.3% |
| Example 4 | 62.3% | Comparative example 4 | 60.2% |
| Example 5 | 52.1% | Comparative example 5 | 51.4% |
| Example 6 | 55.4% | Comparative example 6 | 51.9% |
| Example 7 | 53.9% | Comparative example 7 | 52.6% |

TABLE 3

| | Material of first metal layer | Thickness of first metal layer | Thickness of conductive oxide layer | Material of second metal layer | Thickness of second metal layer |
|---|---|---|---|---|---|
| Example 4 | Gold | 1 nm | 50 nm | Silver | 1 nm |
| Example 5 | Gold | 10 nm | 200 nm | Silver | 10 nm |
| Example 6 | Gold | 1 nm | 200 nm | Silver | 10 nm |
| Example 7 | Gold | 5 nm | 150 nm | Silver | 10 nm |

The test results of the above examples 1-7 and comparative examples 1-7 demonstrate that the performances of the semi-transparent perovskite solar cells based on the "metal-conductive oxide-metal" composite electrode are significantly better than those of the cells based on a blank conductive oxide. On the one hand, such semi-transparent perovskite solar cells have a better transmittance, and can maintain an unaffected semi-transparent effect; and on the other hand, the photoelectrical performances thereof are improved comprehensively. This mainly thanks to the first metal layer, that is the presence of the first metal electrode increases the transport rate of charge carriers between the charge transport layer and the thin-film composite electrode. In addition, the second metal electrode provided on the other side of the conductive oxide layer reduces the overall series resistance of the device and facilitates the increase of the open-circuit voltage and fill factor of the device in a comprehensive manner, thereby improving the efficiency of the cell.

Finally, it should be noted that the above embodiments are merely used for illustrating rather than limiting the technical solutions of the present application. Although the present application has been illustrated in detail with reference to the foregoing embodiments, it should be understood by those of ordinary skill in the art that the technical solutions described in the foregoing embodiments may still be modified, or some or all of the technical features thereof may be equivalently substituted; and such modifications or substitutions do not make the essence of the corresponding technical solution depart from the scope of the technical solutions of the embodiments of the present application, and should fall within the scope of the claims and the description of the present application. In particular, the technical features mentioned in the embodiments can be combined in any manner, provided that there is no structural conflict. The present application is not limited to the specific embodiments disclosed herein but includes all the technical solutions that fall within the scope of the claims.

What is claimed is:

1. A perovskite solar cell, sequentially comprising transparent conductive glass, a first charge transport layer, a perovskite light-absorbing layer, a second charge transport layer and a thin-film composite electrode, wherein the first charge transport layer is a hole transport layer, and the second charge transport layer is an electron transport layer;

and the thin-film composite electrode comprises:

a first metal layer provided on the second charge transport layer, a conductive oxide layer provided on the first metal layer, and a second metal layer provided on the conductive oxide layer, wherein the perovskite light-absorbing layer, the second charge transport layer, the first metal layer, the conductive oxide layer, and the second metal layer in the perovskite solar cell have a LUMO energy level following an order of the perovskite light-absorbing layer>the second charge transport layer>the first metal layer>the conductive oxide layer>the second metal layer.

2. The perovskite solar cell according to claim 1, wherein the metal of the first metal layer is selected from at least one of gold, silver, copper, aluminum and cobalt, and alloys thereof; and the metal of the second metal layer is selected from at least one of gold, silver, copper, aluminum, nickel, zinc, tin and iron, and alloys thereof.

3. The perovskite solar cell according to claim 1, wherein the first metal layer has a work function of −4.95 to −3.5 eV; the conductive oxide layer has a work function of −5.00 to −3.65 eV; the second metal layer has a work function of −5.30 to −3.75 eV; and the work function values of the second charge transport layer, the first metal layer, the conductive oxide layer and the second metal layer are in a descending order; and the absolute value of the difference between the work function values of two adjacent layers is 0.02 eV-0.3 eV.

4. The perovskite solar cell according to claim 1, wherein the conductive oxide layer has a thickness of 50-200 nm; both the first metal layer and the second metal layer have a thickness of 1-10 nm; and the sum of the thickness of the first metal layer and the second metal layer does not exceed 1/10 of the thickness of the conductive oxide layer.

5. A preparation method for a perovskite solar cell, the method comprising:

providing a transparent conductive glass;

preparing a first charge transport layer on the transparent conductive glass, wherein the first charge transport layer is a hole transport layer;

preparing a perovskite light-absorbing layer on the first charge transport layer;

preparing a second charge transport layer on the perovskite light-absorbing layer, wherein the second charge transport layer is an electron transport layer;

forming a thin-film composite electrode on the second charge transport layer, wherein forming the thin-film composite electrode further comprises:

1) Preparing a first metal layer on the second charge transport layer;

2) Preparing a conductive oxide layer on the first metal layer; and 3) preparing a second metal layer on the conductive oxide layer, wherein the perovskite light-absorbing layer, the second charge transport layer, the first metal layer, the conductive oxide layer, and the second metal layer in the perovskite solar cell have a LUMO energy level following an order of the perovskite light-absorbing layer>the second charge transport layer>the first metal layer>the conductive oxide layer>the second metal layer.

6. The preparation method according to claim 5, wherein the first metal layer is prepared by means of evaporation with a vacuum degree $\leq 5\times10^{-4}$ Pa, at a temperature ≤100 °C and a rate ≤0.1 A/s; the conductive oxide layer is prepared by means of vacuum sputtering or vacuum evaporation with a vacuum degree $\leq 5\times10^{-4}$ Pa at a rate of 0.1 A/s to 1 A/s; the second metal layer is prepared by means of vacuum sputtering or vacuum evaporation with a vacuum degree $\leq 5\times10^{-4}$ Pa at a rate of 0.1-0.5 A/s; and the preparation method further comprises:

with the vacuum degree being maintained, cooling to room temperature between step 1) and step 2); and carrying out step 2) and step 3) continuously with the vacuum degree being maintained.

7. A power consuming device, comprising a perovskite solar cell according to claim 1, with the perovskite solar cell being used to supply electrical energy.

8. The preparation method according to claim 5, wherein the metal of the first metal layer is selected from at least one of gold, silver, copper, aluminum and cobalt, and alloys thereof; and the metal of the second metal layer is selected from at least one of gold, silver, copper, aluminum, nickel, zinc, tin and iron, and alloys thereof.

9. The preparation method according to claim 5, wherein the first metal layer has a work function of −4.95 to −3.5 eV; the conductive oxide layer has a work function of −5.00 to −3.65 eV; the second metal layer has a work function of −5.30 t o−3.75 eV; and the work function values of the second charge transport layer, the first metal layer, the conductive oxide layer and the second metal layer are in a descending order; and the absolute value of the difference between the work function values of two adjacent layers is 0.02 eV-0.3 eV.

10. The preparation method according to claim 5, wherein the conductive oxide layer has a thickness of 50-200 nm; both the first metal layer and the second metal layer have a thickness of 1-10 nm; and the sum of the thickness of the first metal layer and the second metal layer does not exceed 1/10 of the thickness of the conductive oxide layer.

* * * * *